(12) United States Patent
Wu et al.

(10) Patent No.: US 10,586,789 B2
(45) Date of Patent: Mar. 10, 2020

(54) MICRO LED DISPLAY PANEL

(71) Applicant: HON HAI PRECISION INDUSTRY CO., LTD., New Taipei (TW)

(72) Inventors: I-Wei Wu, New Taipei (TW); Wei-Chih Chang, New Taipei (TW); Chung-Wen Lai, New Taipei (TW); Sheng-Han Li, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/022,951

(22) Filed: Jun. 29, 2018

(65) Prior Publication Data

US 2019/0013306 A1 Jan. 10, 2019

Related U.S. Application Data

(60) Provisional application No. 62/529,545, filed on Jul. 7, 2017.

(51) Int. Cl.
| | |
|---|---|
| *H01L 25/16* | (2006.01) |
| *H01L 25/075* | (2006.01) |
| *H01L 33/52* | (2010.01) |
| *G09G 3/32* | (2016.01) |
| *H01L 33/62* | (2010.01) |
| *H01L 33/20* | (2010.01) |

(52) U.S. Cl.
CPC ........ *H01L 25/167* (2013.01); *H01L 25/0753* (2013.01); *H01L 33/52* (2013.01); *G09G 3/32* (2013.01); *H01L 33/20* (2013.01); *H01L 33/62* (2013.01)

(58) Field of Classification Search
None
See application file for complete search history.

(56) References Cited

U.S. PATENT DOCUMENTS

2012/0256216 A1* 10/2012 Weng .................. H01L 51/5203
257/98
2016/0372514 A1* 12/2016 Chang ................. H01L 27/1259
2018/0373366 A1 12/2018 Li et al.

FOREIGN PATENT DOCUMENTS

| CN | 107256871 A | 10/2017 |
|---|---|---|
| TW | 201242126 A | 10/2012 |
| TW | 201701458 A | 1/2017 |

* cited by examiner

*Primary Examiner* — Lex H Malsawma
(74) *Attorney, Agent, or Firm* — ScienBiziP, P.C.

(57) ABSTRACT

A micro LED display panel with enhanced display properties includes a substrate, a plurality of micro LEDs on the substrate, at least one common electrode, and a plurality of contact electrodes. Each micro LED includes top and bottom ends and a sidewall between them. The common electrode is coupled to the top end and a contact electrode is coupled to the bottom end. An adjustment electrode insulated from the other electrodes is formed on the sidewall of each of the plurality of micro LEDs; the adjustment electrode being fed with a DC voltage creates an electric field limiting the direction of flow of charge carriers within each micro LED and thereby improving performance.

9 Claims, 4 Drawing Sheets

MICRO LED DISPLAY PANEL

FIELD

The subject matter herein generally relates to micro LED display panels.

BACKGROUND

A conventional micro LED display device generally includes a plurality of micro LEDs spaced apart from each other. Each micro LED emits visible light by recombining electrons and holes. Performance of the micro LED can be improved by adjusting flowing of the carriers (electrons and holes) in the micro LED. Therefore, there is room for improvement in the art.

BRIEF DESCRIPTION OF THE DRAWINGS

Implementations of the present disclosure will now be described, by way of example only, with reference to the attached figures.

DETAILED DESCRIPTION

Figure 1:
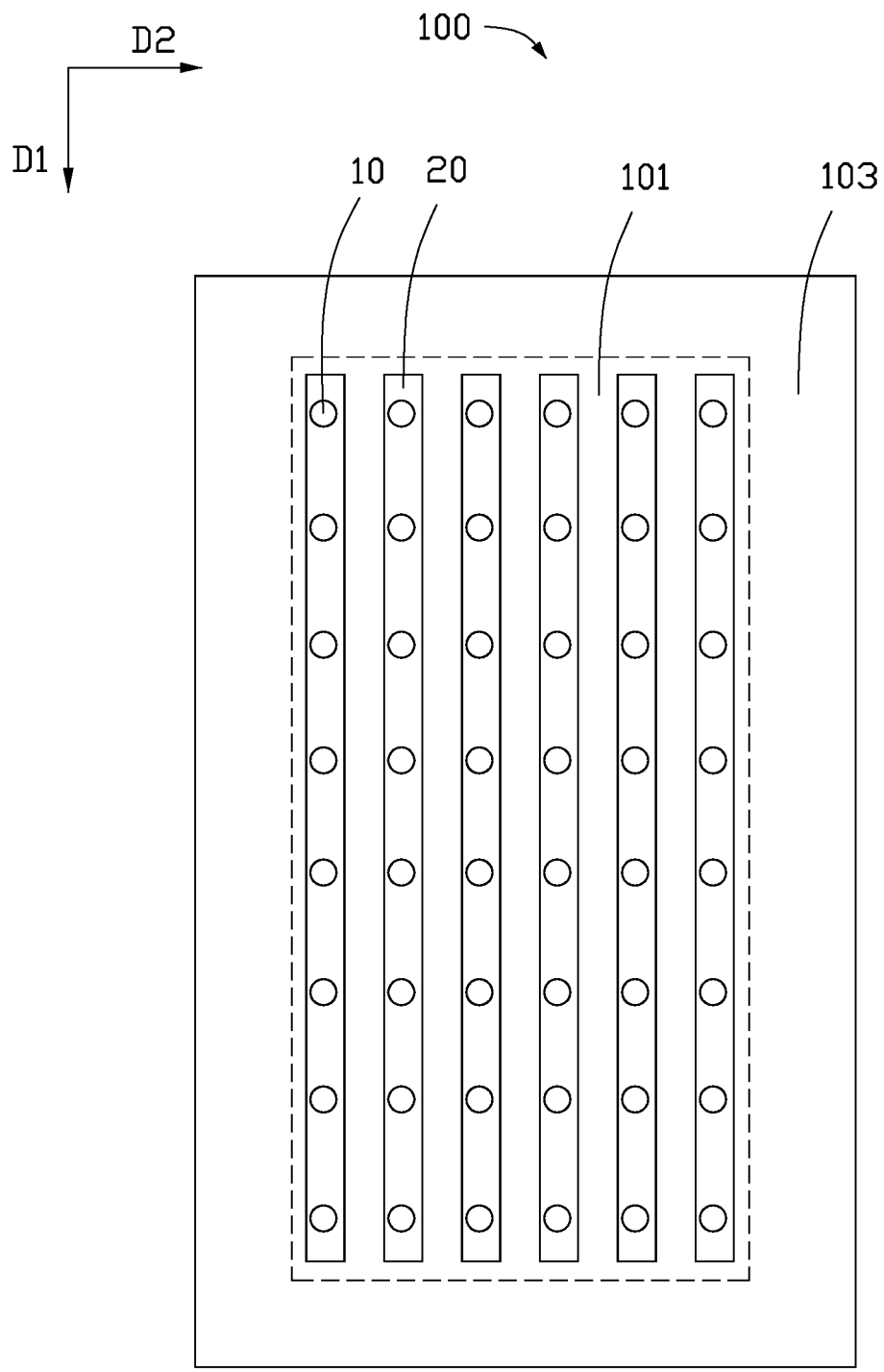
FIG. 1 is a planar view illustrating an embodiment of a micro LED display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

The term "micro LED" in this disclosure refers to an LED having a size of a few millimeters or less (e.g. several millimeters, several hundred micrometers, or less than 100 micrometers).

FIG. 1 illustrates a micro LED display panel 100 according to an embodiment. The micro LED display panel 100 defines a display area 101 and a non-display area 103 surrounding the display area 101. A plurality of micro LEDs 10 and a plurality of common electrodes 20 are located in the display area 101. The micro LEDs 10 are configured for emitting light to achieve display.

As shown in FIG. 1, the micro LEDs 10 are arranged in a matrix and correspond to the common electrodes 20. Each common electrode 20 serves as an anode or a cathode of at least one micro LED 10. In this embodiment, the plurality of common electrodes 20 are spaced apart and insulated from each other, each common electrode 20 covers and contacts two or more micro LEDs 10 in a direction. It can be understood that, in other embodiments, each common electrode 20 may contact and cover one micro LED 10. In other embodiments, only one common electrode 20 may be provided, and the common electrode 20 contacts and covers all of the micro LEDs 10.

Figure 2:
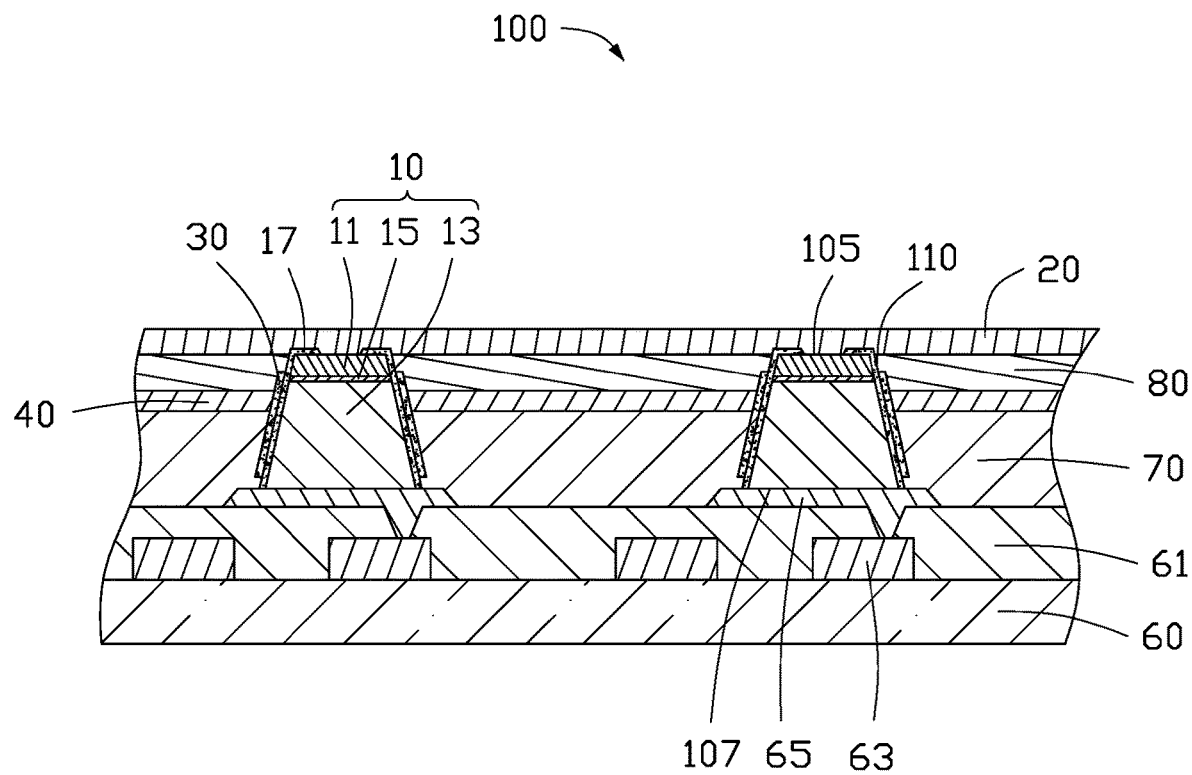
FIG. 2 is a cross-sectional view illustrating the micro LED display panel according to a first embodiment.

Referring to FIG. 2, the micro LED display panel 100 further includes a substrate 60 and a display driving layer 61 formed on a surface of the substrate 60. The display driving layer 61 includes a plurality of thin film transistors 63. The common electrodes 20 and the micro LEDs 10 are located at a side of the display driving layer 61 away from the substrate 60. The micro LEDs 10 are on the display driving layer 61. Each micro LED 10 has a bottom end 107 adjacent to the substrate 60 and a top end 105 away from the substrate 60. The common electrode 20 contacts and covers the top ends 105 of at least two micro LEDs 10. A plurality of contact electrodes 65 is provided between the micro LEDs 10 and the display driving layer 61. Each contact electrode 65 contacts and covers the bottom end 107 of one micro LED 10. The common electrode 20 and the contact electrode 65 serve as an anode and a cathode respectively of the micro LED 10. When the common electrode 20 and the contact electrode 65 are applied with different voltages, to generate a potential difference, the micro LED 10 emits light. Each contact electrode 65 is electrically coupled to one thin film transistor 63 in the display driving layer 61. The plurality of contact electrodes 65 may be formed by patterning a single conductive layer.

Further referring to FIG. 2, a first insulating layer 70 and a second insulating layer 80 are provided at a side of the display driving layer 61 away from the substrate 60. The first insulating layer 70 is on the display driving layer 61 and covers the contact electrodes 65. The second insulating layer 80 is formed on a side of the first insulating layer 70 away from the display driving layer 61. Each micro LED 10 is embedded in the first insulating layer 70 and the second insulating layer 80 but partially exposed from the second insulating layer 80.

As shown in FIG. 2, each common electrode 20 is located at a side of the second insulation layer 80 away from the first insulation layer 70, and each common electrode 20 directly contacts/covers at least one micro LED 10.

As shown in FIG. 2, each micro LED 10 includes a sidewall 110 connecting the bottom end 107 and the top end 105, and the sidewall 110 is between the bottom end 107 and the top end 105 and faces the first insulation layer 70 and the second insulation layer 80. The sidewall 110 of each micro LED 10 is covered by a dielectric layer 17 to protect and electrically insulate the micro LEDs 10 from each other. In this embodiment, the dielectric layer 17 further extends and partially covers the top end 105 of the micro LED 10. A portion of the top end 105 of each micro LED 10 that is not covered by the dielectric layer 17 is covered by the common electrode 20.

Figure 3:
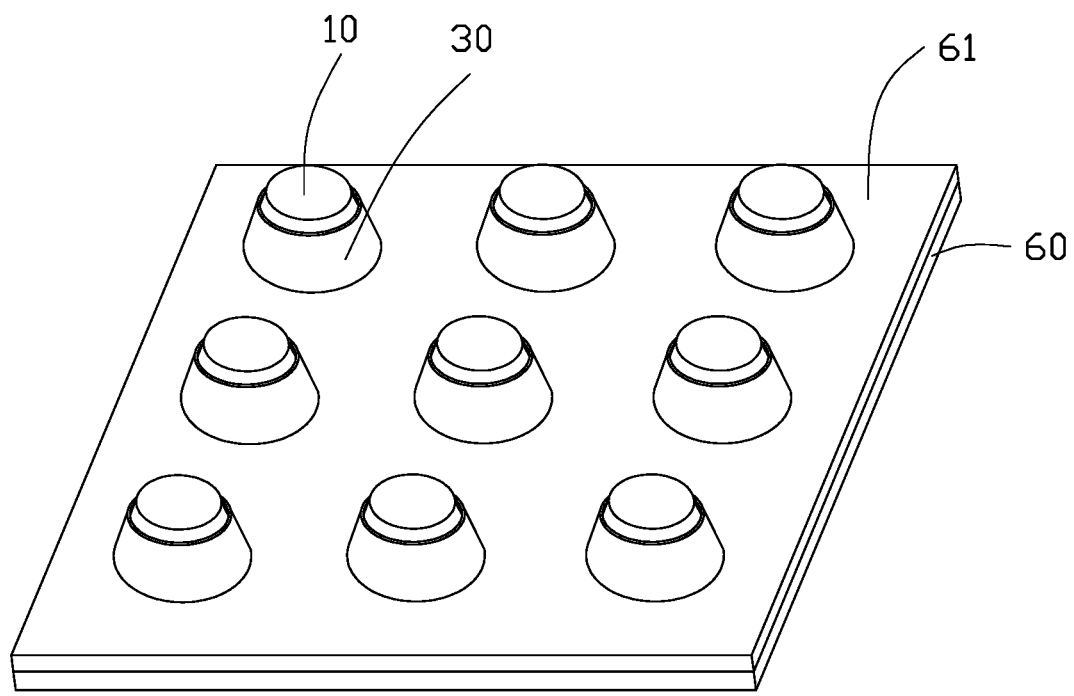
FIG. 3 shows a layout of micro LEDs of the micro LED display panel.

As shown in FIG. 2, an adjustment electrode 30 is also formed on the sidewall 110 of each micro LED 10. FIG. 3 shows the micro LEDs 10 and adjustment electrodes 30. As shown in FIG. 3, the adjustment electrode 30 surrounds the micro LED 10. As shown in FIG. 2, the adjustment electrode 30 is formed on a side of the dielectric layer 17 away from the micro LED 10. The dielectric layer 17 is between each micro LED 10 and the adjustment electrode 30. The adjustment electrode 30 does not make contact with the contact electrode 65 and the common electrode 20. The adjustment electrode 30 is electrically insulated from the contact electrode 65 and the common electrode 20.

As shown in FIG. 2, the micro LED display panel 100 further includes a connecting electrode 40 that directly connect/contact the adjustment electrodes 30 of each micro LED 10. In this embodiment, the connecting electrode 40 is located between the first insulating layer 70 and the second insulating layer 80. An adjusting voltage is applied to the adjustment electrode 30 by the connecting electrode 40. The adjusting voltage is a direct current (DC) voltage which is different from the anode voltage and the cathode voltage of the micro LED 10.

In an embodiment, the adjusting voltage applied to the adjustment electrode 30 is in a range of about −4V to about 4V, the anode of the micro LED 10 receives a voltage of 2.5V, and the cathode of the micro LED 10 is grounded (0 V).

The adjustment electrode 30 and the common electrode 20 form an electric field, and the adjustment electrode 30 and the contact electrode 65 form an electric field, thus, the direction of flow of carriers (electrons and holes) inside the micro LED 10 is limited, and so the performance of the micro LED 10 is enhanced and the display effects of the micro LED display panel 100 is improved.

Each micro LED 10 may be a conventional micro LED 10. As an example, each micro LED 10 can include a P-type doped light-emitting material layer 11, an N-type doped light-emitting material layer 13, and an active layer 15 between the P-type doped light-emitting material layer 11 and the N-type doped light-emitting material layer 13, as shown in FIG. 2. In this embodiment, the P-type doped light-emitting material layer 11, the active layer 15, and the N-type doped light-emitting material layer 13 are all on the substrate 60. The P-type doped light-emitting material layer 11 is coupled to the common electrode 20, and the N-type doped light-emitting material layer 13 is coupled to the contact electrode 65.

Figure 4:
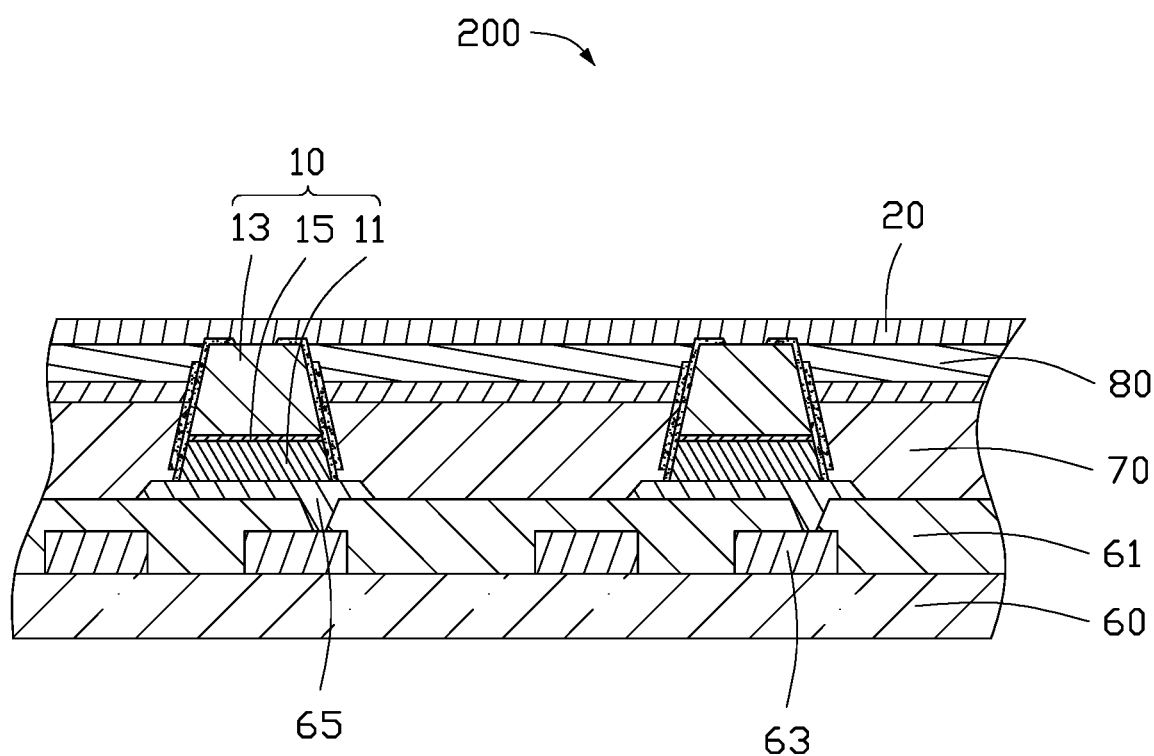
FIG. 4 is a cross-sectional view of the micro LED display panel according to a second embodiment.

FIG. 4 illustrates a micro LED display panel (micro LED display panel 200) according to a second embodiment of the present disclosure. The micro LED display panel 200 is substantially the same as the micro LED display panel 100 of the first embodiment, except the order of stacking is different from that in the micro LED display panel 100. In this second embodiment, the P-doped light-emitting material layer 11, the active layer 15, and the N-doped light-emitting material layer 13 are stacked in that order above the substrate 60. The P-doped light-emitting material layer 11 is relatively adjacent to the substrate 60. In this way, the N-type doped light emitting material layer 13 directly connects/contacts the common electrode 20, and the P-doped light-emitting material layer 11 directly connects/contacts the contact electrode 65.

In this embodiment, since the stacking order of the P-doped light-emitting material layer 11, the active layer 15, and the N-doped light-emitting material layer 13 in the micro LED 10 changes, the voltages applied to the cathode and the anode of the micro LED 10 are adjusted so that the micro LED 10 emits light.

It can be understood that the thin film transistor 63 is a conventional thin film transistor used in the art and specifically may include a gate electrode (not shown) and a semiconductor layer (not shown). A source electrode (not shown) and a drain electrode (not shown) are coupled to opposite sides of the semiconductor layer. The thin film transistors 63 in the display driving layer 61 may include two functional types, namely a driving thin film transistor 63 and a switching thin film transistor 63. The driving thin film transistor 63 is electrically coupled to the contact electrode 65 and configured to output current to the micro LED 10. The switching thin film transistor 63 is configured to control the driving thin film transistor 63 to be on or off, and is electrically coupled to a scan line (not shown) and a data line (not shown).

It can be understood that the common electrode 20 may be made of various transparent conductive materials commonly used in the field, such as indium tin oxide. The contact electrode 65, the adjustment electrode 30, and the connecting electrode 40 may be made of various conductive materials that are conventionally used in the art, such as conductive metal, indium tin oxide, and the like. It can be understood that the substrate 60 can be made of materials such as glass, plastic, and the like as commonly used in the art.

The adjustment electrode 30 is provided on the side wall 110 of the micro LED, so that the charge carriers (electrons and holes) in the micro LED 10 are limited, and performance of the micro LED 10 is improved.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A micro LED display panel, comprising:
a substrate;
a plurality of micro LEDs on the substrate, the plurality of micro LEDs being spaced apart from each other, each of the plurality of micro LEDs comprising a top end away from the substrate, a bottom end adjacent to the substrate, and a sidewall coupling the top end and the bottom end, the sidewall being between the top end and the bottom end;
at least one common electrode, the at least one common electrode coupled to the top end of each of the plurality of micro LEDs; and
a plurality of contact electrodes, each of the plurality of contact electrodes coupled to the bottom end of one of the plurality of micro LEDs;
wherein an adjustment electrode is formed on the sidewall of each of the plurality of micro LEDs; the adjustment electrode is electrically insulated from the at least one common electrode and the plurality of contact electrodes;
wherein the sidewall of each of the plurality of micro LEDs is covered with a dielectric layer; the dielectric layer is located between the sidewall and the adjustment electrode; the dielectric layer extends to partially cover the top end; a portion of the top end that is not covered by the dielectric layer is covered by the at least one common electrode.

2. The micro LED display device of claim 1, wherein the adjustment electrode surrounds one of the plurality of micro LEDs.

3. The micro LED display device of claim 1, further comprising a display driving layer on a surface of the substrate, a first insulating layer on a side of the display driving layer away from the substrate, and a second insulating layer on a side of the first insulating layer away from the substrate; wherein the plurality of micro LEDs are embedded in the first insulating layer and the second insulating layer and partially exposed from the second insulating layer; the plurality of micro LEDs are at a side of the display driving layer away from the substrate.

4. The micro LED display device of claim 3, wherein the at least one common electrode is on a side of the second insulating layer away from the substrate; each of the plurality of contact electrodes is between one of the plurality of micro LEDs and the display driving layer; each of the plurality of contact electrodes is electrically coupled to the display driving layer.

5. The micro LED display device of claim 4, wherein a connecting electrode is located between the first insulating layer and the second insulating layer; the connecting electrode is coupled to the adjustment electrode of each of the plurality of micro LEDs; the adjustment electrode is applied with an adjusting voltage by the connecting electrode.

6. The micro LED display device of claim 5, wherein the adjusting voltage is a direct current voltage different from voltages applied to the contact electrode and the common electrode.

7. The micro LED display device of claim 1, wherein each of the plurality of micro LEDs comprises a P-type doped light-emitting material layer, an N-type doped light-emitting material layer, and an active layer between the P-type doped light-emitting material layer and the N-type doped light-emitting material layer.

8. The micro LED display device of claim 7, wherein the P-type doped light-emitting material layer is coupled to the at least one common electrode; the N-type doped light-emitting material layer is coupled to the contact electrode.

9. The micro LED display device of claim 7, wherein the N-type doped light-emitting material layer is coupled to the at least one common electrode; the P-type doped light-emitting material layer is coupled to the contact electrode.

* * * * *